United States Patent
Ninomiya

(10) Patent No.: US 9,338,369 B2
(45) Date of Patent: May 10, 2016

(54) DRIVING CIRCUIT FOR VOICE COIL MOTOR, LENS MODULE AND ELECTRONIC DEVICE USING THE SAME, AND DRIVING METHOD FOR VOICE COIL MOTOR

(71) Applicant: ROHM CO., LTD., Ukyo-ku, Kyoto (JP)

(72) Inventor: Tatsuya Ninomiya, Kyoto (JP)

(73) Assignee: ROHM CO., LTD. (JP)

( * ) Notice: Subject to any disclaimer, the term of this patent is extended or adjusted under 35 U.S.C. 154(b) by 0 days.

(21) Appl. No.: 14/604,005

(22) Filed: Jan. 23, 2015

(65) Prior Publication Data

US 2015/0256731 A1    Sep. 10, 2015

(30) Foreign Application Priority Data

Mar. 4, 2014   (JP) .................. 2014-041520

(51) Int. Cl.
| | |
|---|---|
| H04N 5/228 | (2006.01) |
| H04N 5/238 | (2006.01) |
| H04N 5/232 | (2006.01) |
| G01R 23/00 | (2006.01) |
| H02P 25/02 | (2016.01) |

(52) U.S. Cl.
CPC .............. *H04N 5/238* (2013.01); *G01R 23/00* (2013.01); *H04N 5/23212* (2013.01); *H04N 5/23287* (2013.01); *H02P 25/028* (2013.01)

(58) Field of Classification Search
USPC ...................................... 348/208.11
See application file for complete search history.

(56) References Cited

U.S. PATENT DOCUMENTS

2010/0201301 A1    8/2010   Lyden et al.

FOREIGN PATENT DOCUMENTS

| | | |
|---|---|---|
| JP | 09298430 A | 11/1997 |
| JP | 2004012492 A | 1/2004 |
| JP | 2008043171 A | 2/2008 |
| JP | 2008113506 A | 5/2008 |
| JP | 2013048403 A | 3/2013 |

*Primary Examiner* — Roberto Velez
*Assistant Examiner* — Stephen Coleman
(74) *Attorney, Agent, or Firm* — Cantor Colburn LLP

(57) ABSTRACT

A driving circuit for controlling a driving current is provided. A D/A converter has a precision of N bits and outputs a control signal for a driving current to a current driver. A logic unit receives input control data of M bits (M>N) and outputs intermediate control data of N bits to the D/A converter. A data extraction unit divides the input control data into a first data having N bits from the MSB and a second data having (M−N) bits from the LSB. A counter accumulatively adds the second data to generate a count. A carry detection unit asserts a carry signal when a carry at the MSB of the count is generated by the counter. An output control unit 66 converts the intermediate control data into the first data or a third data, in which 1 LSB is added to the first data, according to the carry signal.

13 Claims, 7 Drawing Sheets

DRIVING CIRCUIT FOR VOICE COIL MOTOR, LENS MODULE AND ELECTRONIC DEVICE USING THE SAME, AND DRIVING METHOD FOR VOICE COIL MOTOR

CROSS-REFERENCE TO RELATED APPLICATION

This application is based upon and claims the benefit of priority from Japan Patent Applications No. 2014-041520, filed on Mar. 4, 2014, the entire contents of which are incorporated herein by reference.

TECHNICAL FIELD

The present disclosure relates to a control technique of a voice coil motor.

BACKGROUND

An actuator for positioning a focusing lens is installed in digital still cameras, digital video cameras, or electronic devices (e.g., cellular phones) having an image acquisition functional unit. The actuator may be a stepping motor type actuator, a piezoelectric type actuator, or a voice coil motor (VCM) type actuator.

In the VCM type actuator, a driving force may be generated in a linear direction that corresponds to a direction of a current that flows through a coil. There have been known a spring return type and a bi-directional driving type as a VCM driving type.

In a VCM having a spring return mechanism, a driving force in a first direction is generated when a driving current is supplied to the coil and a driving force in a second direction that is the opposite direction of the first direction is generated using a force of a spring installed at a mover. That is to say, both the electrical driving force and the mechanical driving force are employed. For example, when driving the VCM having the spring return mechanism, the driving current may be supplied only in a single direction of the coil so as to simplify a driving circuit.

Meanwhile, a VCM of the bi-directional driving type employs a driving circuit capable of sourcing or sinking a driving current from each ends of the VCM, such as an H-bridge circuit. In the bi-directional driving type, it is possible to switch the direction of the coil current, and thus driving forces in the positive direction and the negative direction are obtained.

FIG. 1 is a circuit diagram of a driving circuit 2r of a comparative technology that the inventor of the present disclosure has considered. The driving circuit 2r includes a logic unit 10, a D/A converter 12, and a current driver 14. The logic unit 10 receives input control data S1, which indicates a target location of a VCM 4, in a serial format from a microcomputer (not shown). The logic unit 10 generates a digital command value S2, which corresponds to the input control data S1, and outputs it to the D/A converter 12. The D/A converter 12 converts the digital command value S2 into an analog control signal S3. The current driver 14 generates a driving current $I_{DRV}$ according to the analog control signal S3.

Conventionally, the resolution of the D/A converter 12 is approximately 10 bits, 1024 gradations. For such D/A converter, the lower M bits are configured as an R2R type and the upper (10−M) bits are configured as a segment type, thereby securing a required precision for the resolution while suppressing an increase of a circuit area.

Recently, the resolution required for the control of the VCM has been increasing. However, if the resolution of the D/A converter is increased to e.g. 11 bits, 12 bits and more, it leads to a problem that the circuit area of the D/A converter exponentially increases.

The present disclosure has been made in order to solve such a problem. One exemplary object of an embodiment of the present disclosure is to provide a driving circuit capable of controlling a driving current with high precision, while suppressing the increase of the circuit area.

SUMMARY

According to an aspect of the present disclosure, there is provided a driving circuit configured to supply a driving current to a voice coil motor. The driving circuit includes a D/A converter of a second number (N) of bits, wherein the second number (N) is an integer; a current driver configured to generate the driving current based on a control signal outputted from the D/A converter; and a logic unit configured to receive an input control data having a first number (M) of bits and output an intermediate control data having the second number (N) of bits to the D/A converter. The first number (M) is an integer larger than the second number (N). The logic unit comprises a data extraction unit configured to divide the input control data into a first data having the second number (N) of bits from a most significant bit of the input control data and a second data having a third number (M−N) of bits from a least significant bit of the input control data, wherein the third number (M−N) corresponds to a number from subtracting the second number (N) from the first number (M); a counter configured to accumulatively add the second data in synchronization with a clock signal to generate a count value having the third number (M−N) of bits; a carry detection unit configured to assert a carry signal when a carry at a most significant bit of the count value is generated by the counter; and an output control unit configured to set the intermediate control data as the first data in a cycle where the carry signal is negated or set the intermediate control data as a third data, in which one least significant bit is added to the first data, in a cycle where the carry signal is asserted.

According to the embodiment, the resolution of the D/A converter of N bits can be effectively increased to M bits while suppressing an increase in hardware resources of the circuit in its entirety.

According to some embodiments, the driving circuit may include a low-pass filter interposed between the D/A converter and the current driver. In this case, it is possible to smooth ripples.

According to some embodiments, the current driver may include an integrated amplifier. In the above case, it is possible to smooth ripples without interposing a low-pass filter.

According to some embodiments, the current driver may include an output transistor and a detection resistor, which are arranged in series between a fixed voltage terminal and an output terminal where the voice coil motor is connected; and an error amplifier configured to receive a detection voltage according to the voltage decrease of the detection resistor at its first input, receive a control signal at its second input, and have its output connected to a control terminal of the output transistor.

According to some embodiments, the error amplifier may be an integrated amplifier.

According to some embodiments, the current driver may include an H-bridge circuit connected to both ends of the voice coil motor; a detection resistor arranged in series with the voice coil motor; an error amplifier configured to amplify the difference between a control signal and a detection voltage according to the voltage decrease of the detection resistor; and a pre-driver configured to control the H-bridge circuit based on the output voltage of the error amplifier.

According to some embodiments, the error amplifier may by an integrated amplifier.

According to some embodiments, the driving circuit may be integrated into a single semiconductor substrate. The term "integration" in this disclosure refers to not only a case where all circuit elements are formed on a semiconductor substrate but also a case where only main circuit elements are integrated. Therefore, some elements for adjustment of circuit parameters, such as resistors and capacitors may be installed outside the semiconductor substrate.

According to another aspect of the present disclosure, there is provided a lens module including a focusing lens; a voice coil motor having its mover connected to the focusing lens and having a bi-directional or spring return mechanism; and a driving circuit according to any of the aforementioned embodiments, configured to drive the voice coil motor.

According to still another aspect of the present disclosure, there is provided a lens module including a hand-shake correction lens; a voice coil motor having its mover connected to the shake correction lens and having a bi-directional or spring return mechanism; and a driving circuit according to any of the aforementioned embodiments, configured to drive the voice coil motor.

According to still another aspect of the present disclosure, there is provided an electronic device. The electronic device includes one of the aforementioned lens modules, and an image acquiring device configured to acquire an image from light that passes through the lens module.

DETAILED DESCRIPTION

Figure 1:
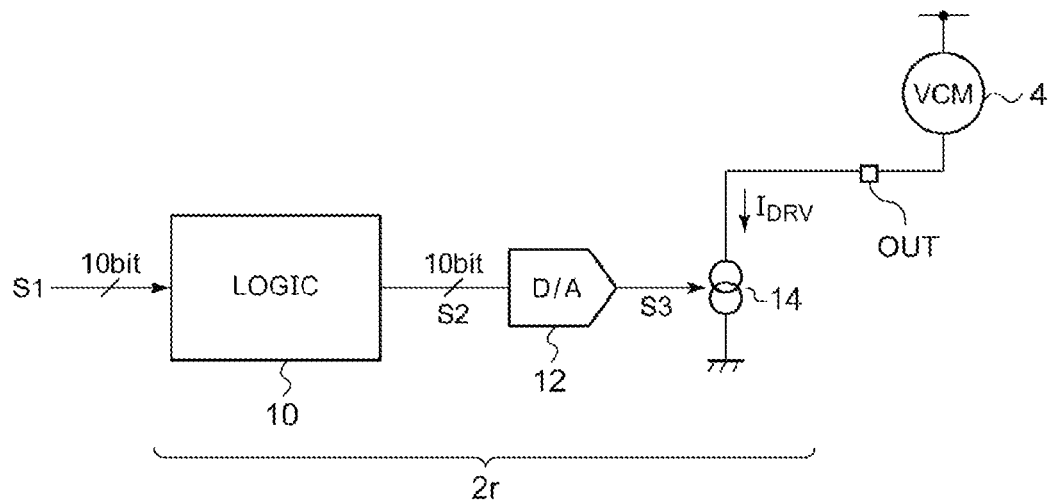
FIG. 1 is a circuit diagram of a driving circuit of a comparative technology that the inventor of the present disclosure has considered.

The present disclosure will now be described according to some embodiments with reference to the drawings. For each drawing, the same or similar elements, members and processes are denoted by the same reference numerals and explanation of which will not be repeated. In addition, the embodiments do not intend to limit the scope of the present disclosure but exemplify the disclosure. All of the features or the combinations thereof described in the embodiments are not necessarily essential to the present disclosure.

In the present disclosure, a state represented by the phrase "a member A is connected to a member B" includes a state of direct physical connection of the member A and the member B as well as a state of indirect connection thereof via other member, as long as the other member has no substantial effect on the electrical connection between the member A and the member B or has no damage to functions and effects achieved by the combination of the member A and the member B. Similarly, the state represented by the phrase "interposition of a member C between a member A and a member B" includes a state of direct connection of the member A and the member C or direct connection of the member B and the member C as well as indirect connection thereof via other member, as long as the other member has no substantial effect on the electrical connection of the member A, the member B, and the member C or has no damage to functions and effects achieved by the combination of the member A, the member B, and the member C.

Figure 2:
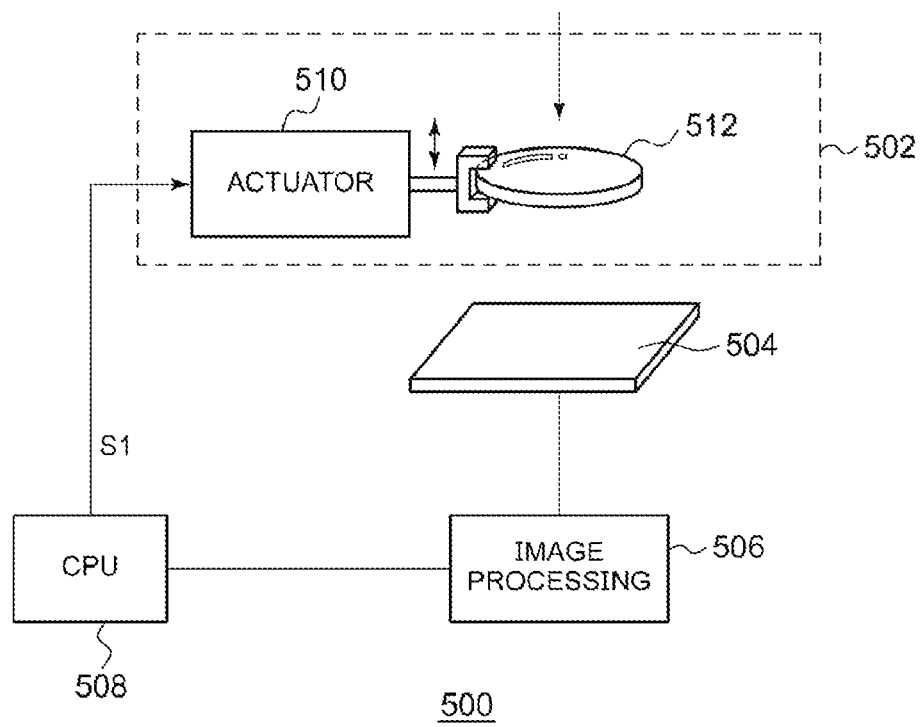
FIG. 2 is a block diagram showing an overall configuration of an electronic device according to an embodiment.

FIG. 2 is a block diagram showing an overall configuration of an electronic device 500 according to an embodiment. The electronic device 500 may be e.g., a cellular phone having an image acquisition functional unit, a digital still camera, a video camera, or a WEB camera, a tablet PC (Personal Computer), which includes a lens module 502, an image acquisition device 504, an image processing processor 506, and a CPU (Central Processing Unit) 508.

The lens module 502 is installed in order to implement so-called the auto-focus function and includes a focusing lens 512 and an actuator 510. The lens 512 is movably supported in an optical axis direction. The actuator 510 controls the location of the lens 512 based on a command value S1 from the CPU 508.

The light (image) passing through the lens 512 enters the image acquisition device 504. The image processing processor 506 reads the image data from the image acquisition device 504.

The CPU 508 determines the target location of the focusing lens 512 that allows the image passing though the focusing lens 512 to be formed on the image acquisition device 504, based on the image read by the image processing processor 506, and outputs the command value S1 corresponding to the determined target location to the actuator 510.

The above is the overall configuration of the electronic device 500. Next, descriptions will be made regarding the specific configuration of the lens module 502.

Figure 3:
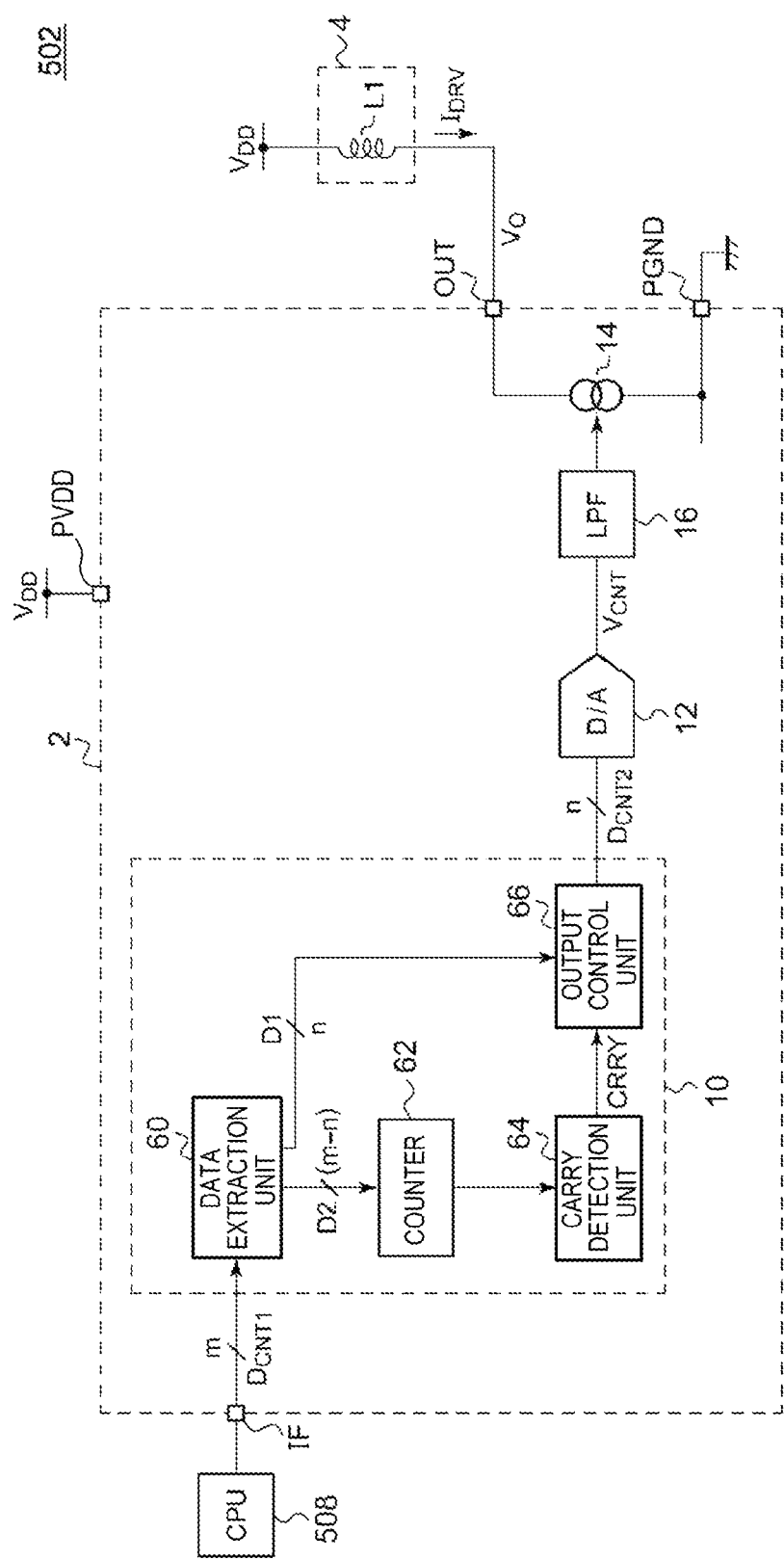
FIG. 3 is a block diagram showing a configuration of a lens module according to an embodiment.

FIG. 3 is a block diagram showing a configuration of the lens module 502 according to an embodiment. The lens module 502 includes a voice coil motor (VCM) 4 and a driving circuit 2.

The VCM 4 is an actuator that positions the focusing lens (512 of FIG. 2), and has a mover connected to the focusing lens. The driving circuit 2 has an output terminal OUT, a power terminal PVDD, a ground terminal PGND, and an interface terminal IF. The driving circuit 2 is a functional Integrated Circuit (IC) integrated into a single semiconductor substrate.

A power voltage $V_{DD}$ is supplied to the power terminal PVDD and a ground voltage $V_{GND}$ is supplied to the ground terminal PGND. The interface terminal IF is connected to the external CPU 508 via a bus, and the input control data $D_{CNT1}$, which indicates the stroke amount (target location, displacement) of the mover of the VCM 4, is supplied from the CPU 508 to the driving circuit 2.

In the present embodiment, the VCM 4 has a spring return mechanism. On one end of the coil L1 of the VCM 4 is connected to the output terminal OUT of the driving circuit 2, while the power voltage $V_{DD}$ is supplied to the other end of the coil L1.

The driving circuit 2 supplies a driving current $I_{DRV}$ in one direction (sync direction) to the coil L1 of the VCM 4 according to the input control data $D_{CNT1}$ so as to control the location of the mover.

The driving circuit 2 includes a logic unit 10, a D/A converter 12, a current driver 14, and a low-pass filter 16.

The logic unit 10 receives the input control data $D_{CNT1}$ having M bits (M is an integer) from the CPU 508. The D/A converter 12 has a resolution of N bits (N is an integer). The N bits of the resolution of the D/A converter 12 is smaller than the M bits of the input control data $D_{CNT1}$. The logic unit 10 converts the input control data $D_{CNT1}$ having the M bits into intermediate control data $D_{CNT2}$ having the N bits and outputs the intermediate control data to the D/A converter 12.

The D/A converter 12 converts the intermediate control data $D_{CNT2}$ into an analog control signal $V_{CNT}$. The control signal $V_{CNT}$ is inputted to the current driver 14 via the low-pass filter 16 that is interposed between the D/A converter 12 and the current driver 14. The current driver 14 generates a driving current $I_{DRV}$ according to the control signal $V_{CNT}$ outputted from the D/A converter 12.

The logic unit 10 includes a data extraction unit 60, a counter 62, a carry detection unit 64, and an output control unit 66. The data extraction unit 60 divides the input control data $D_{CNT1}$ [m-1:0] of the M bits into a first data D1 having N bits from a most significant bit of the input control data $D_{CNT1}$ and a second data D2 having (M-N) bits from a least significant bit of the input control data $D_{CNT1}$.

$$D1 = D_{CNT1}[m-1:M-N]$$

$$D2 = D_{CNT1}[M-N-1:0]$$

The counter 62 is synchronized with a clock signal having a clock period T2 that is sufficiently shorter than an update period T1 of the input control data $D_{CNT1}$ to accumulate the second data D2. For example, the update period T1 may be in the order of tens to hundreds of µs, while the period T2 of the clock signal may be in the order of several MHz.

If the counter 62 generates a carry at the most significant bit (i.e., the (M-N)th bit from the least significant bit (LSB)) in a count value COUNT, which means that there is a change in the (M-N+1)th bit from the least significant bit in the count value COUNT, the carry detection unit 64 asserts a carry signal CRRY (for example, a high level signal).

The output control unit 66 sets the intermediate control data $D_{CNT2}$ with the first data D1 in a cycle where the carry signal CRRY is negated (for example, a low level signal). The output control unit 66 sets the intermediate control data $D_{CNT2}$ with a third data D3, in which 1 LSB is added to the first data D1, in a cycle where the carry signal CRRY is asserted. The output control unit 66 outputs the first data D1 and the third data D3 in a time division manner with the clock period T2. The ratio of the first data D1 to the third data D3 depends on the second data D2.

Figure 4:
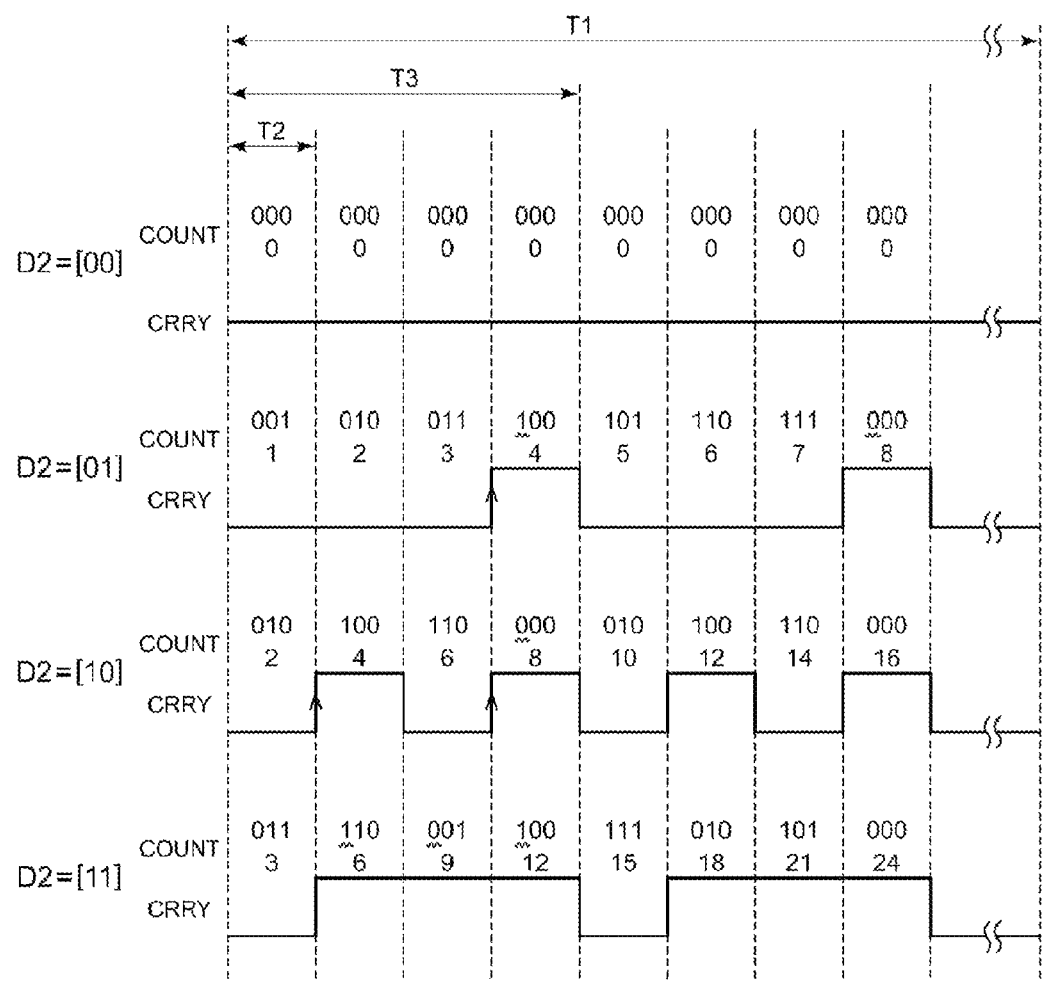
FIG. 4 is a waveform diagram showing an operation of the driving circuit of FIG. 2.
Figure 5:
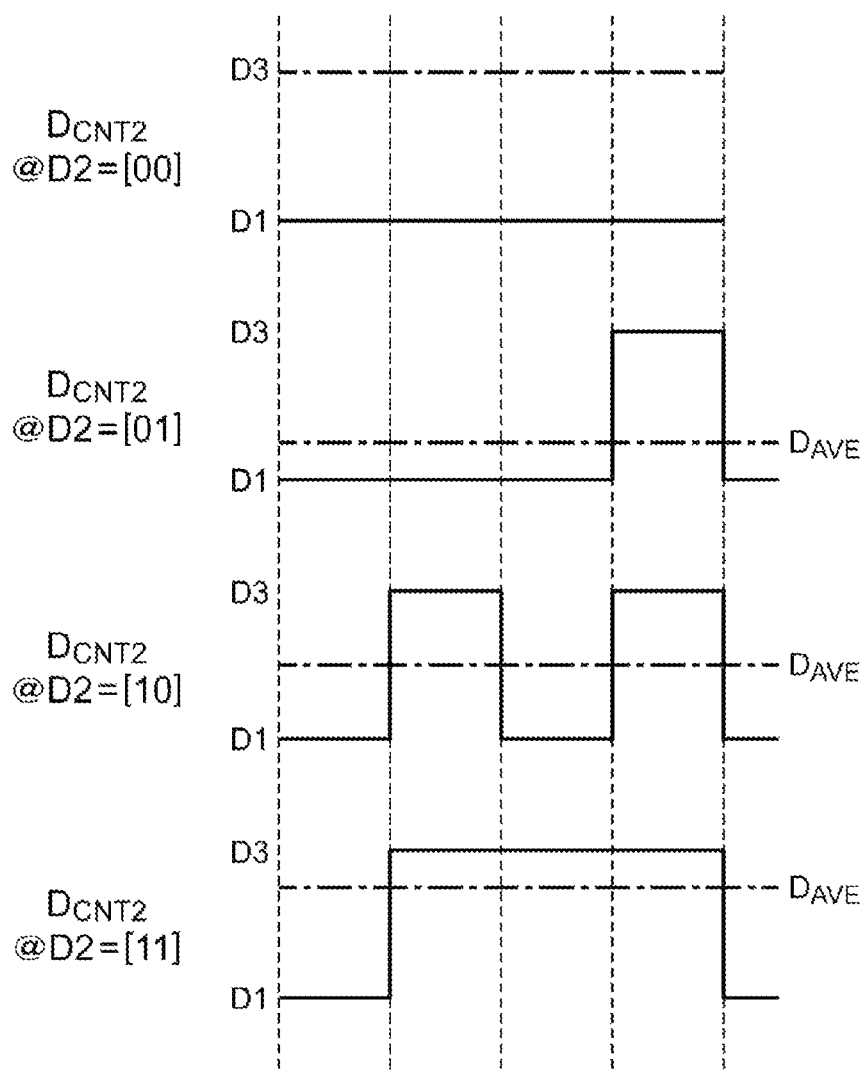
FIG. 5 is a waveform diagram showing an operation of the driving circuit of FIG. 2.

The above is the configuration of the driving circuit 2. Subsequently, the operations of the driving circuit 2 will be described. FIGS. 4 and 5 are waveform diagrams showing the operations of the driving circuit 2 of FIG. 2. Hereinafter, as an example, a case where M=12 bits and N=10 bits will be described. In addition, k and T2 are set as k=1 and $T2 = T1/2^{(12-10)+1} = T1/8$.

For example, assume $D_{CNT1} = [X_1X_2X_3X_4X_5X_6X_7X_8X_9X_{10}Y_1Y_2]$. In this case, the first data D1 is $[X_1X_2X_3X_4X_5X_6X_7X_8X_9X_{10}]$, which corresponds to the N bits from the most significant bit of $D_{CNT1}$. Each of $X_i$ may be set as 1 or 0 and each of $Y_j$ may be set as 1 or 0. The second data D2 is $[Y_1Y_2]$, which corresponds to the (M-N) bits from the least significant bit of $D_{CNT1}$.

FIG. 4 shows the count value COUNT and the carry signal CRRY of the counter 62 for each of the cases where D2=$[Y_1Y_2]$=[00], [01], [10], or [11]. As the count value COUNT, both the binary values and decimal values of the lower 3 bits are indicated. When the binary data of the (M-N) bits is accumulated, the lower (M-N) bits of the count value COUNT transits according to a period of $T3 = T2 \times 2^{(M-N)}$.

In case of D2=[00], the count value COUNT in which D2 is accumulated is always zero. Since the 3(=M-N+1)rd bit from the least significant bit of the count value COUNT does not change, a carry signal CRRY is negated (a low level).

In case of D2=[01], the 3rd bit from the least significant bit of the count value COUNT changes at the 4th cycle of the period T3. Namely, the carry signal CRRY is asserted in every 4 cycles.

In case of D2=[10], the 3rd bit from the least significant bit of the count value COUNT changes at the 2nd cycle and the 4th cycle of the period T3, respectively. Namely, the carry signal CRRY is asserted twice in 4 cycles.

In case of D2=[11], the 3rd bit from the least significant bit of the count value COUNT changes at the 2nd cycle, 3rd cycle, and the 4th cycle of the period T3, respectively. Namely, the carry signal CRRY is asserted 3 times in 4 cycles.

FIG. 5 shows the intermediate control data $D_{CNT2}$ outputted from the logic unit 10 for each of the cases where D2=$[Y_1Y_2]$=[00], [01], [10], or [11]. The average value $D_{AVE}$ of the intermediate control data $D_{CNT}$ is D1 if D2=[00], D1+1/4 if D2=[01], D1+2/4 if D2=[10], and D1+3/4 if D2=[11].

The current driver 14 generates a driving current $I_{DRV}$, which is proportional to the intermediate control data $D_{CNT2}$ that transits with the clock period T2. Therefore, the average current of the driving current $I_{DRV}$ has an amount corresponding to one of D1, $D1+1/2^{(M-N)}$, $D1+2/2^{(M-N)}$, and $D1+3/2^{(M-N)}$. This means that the average current of the driving current $I_{DRV}$ can be controlled with a precision of N+2=M bits.

The above is the operation of the driving circuit 2. Subsequently, the advantages of the driving circuit 2 will be described.

According to the driving circuit 2, it is possible to generate a driving current $I_{DRV}$, which has a resolution (M bits) larger than N bits, while maintaining the bit number of the D/A converter 12 as N bits. As compared to the driving circuit 2r of FIG. 1, the data extraction unit 60, the counter 62, the carry detection unit 64, and the output control unit 66 are added as hardware of the logic unit 10. However, a circuit for implementing all these functions may occupy merely a small area. In other words, the chip area of the entire driving circuit 2 can be made much smaller than a case where the D/A converter 12 is configured with M bits.

In addition, as shown in FIG. 5, it should be noted that the first data D1 and the third data D3 are arranged not to congregate, respectively. For example, if D2=[10], D1D1D3D3 may be considered as a pattern that allows the same duty ratio of 50%. However, such pattern is undesirable since the frequency of the intermediate control data $D_{CNT2}$ is reduced to 1/2 of that in FIG. 5. According to the driving circuit 2 according to the embodiment, it is possible to suppress a frequency variation of the intermediate control data $D_{CNT2}$.

Moreover, it is assumed that the D/A converter 12 in the driving circuit 2r of FIG. 1 is configured to have a resolution of M bits, which are relatively large. In this case, the number of bits of the input control data $D_{CNT1}$ is fixed to a value of M or less. On the other hand, with the driving circuit 2 according to the embodiment, the number M of bits of the input control data $D_{CNT1}$ is not restricted by a value of N of the resolution of the D/A converter 12. That is, when the number M of bits for the input control data $D_{CNT1}$ is assumed to be up to a maximum $M_{MAX}$, if the counter 62 is designed such that the second data D2 having the number ($M_{MAX}$–N) of bits can be accumulated, it is possible to deal with any number M for the input control data $D_{CNT1}$. This means that the CPU 508 does not need to be conscious of the value for M bits of the input control data $D_{CNT1}$, and therefore it is understood as being user-friendly.

The scope of the present disclosure applies to any circuit that is understood from the block diagram of FIG. 2. Hereinafter, however, specific configurations of some of those driving circuits 2 will be described.

Figure 6:
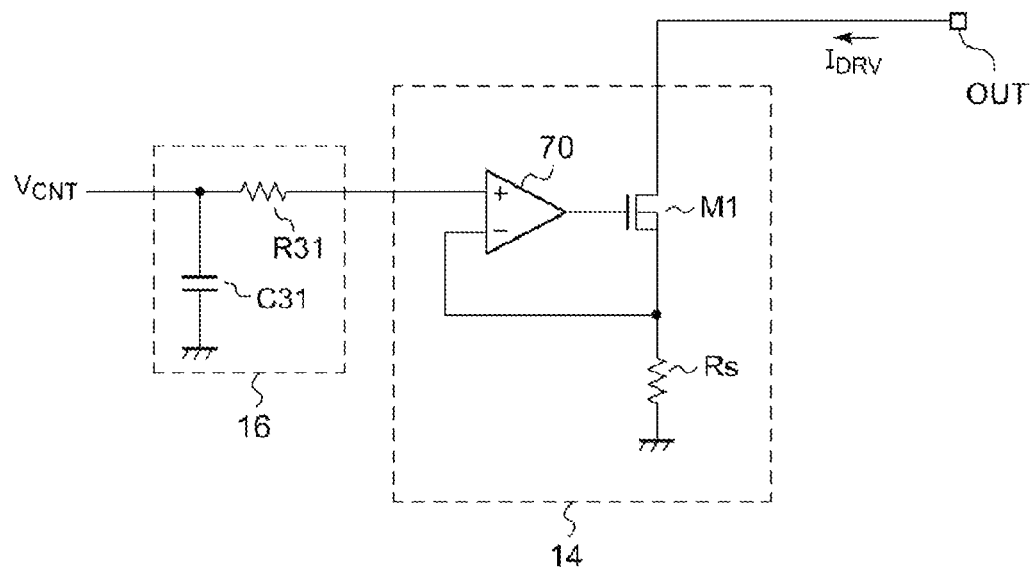
FIG. 6 is a circuit diagram of a driving circuit related to the first embodiment.

FIG. 6 is a circuit diagram of a driving circuit 2 related to the first embodiment. FIG. 6 only shows the current driver 14 and the low-pass filter 16 and the other elements are omitted. The low-pass filter 16 is an RC filter including a capacitor C31 and a resistor R31.

The current driver 14 includes an output transistor M1, a detection resistor Rs, and an error amplifier 70. The output transistor M1 and the detection resistor Rs are arranged in series between a fixed voltage terminal (ground terminal) and an output terminal OUT connected to the voice coil motor. The error amplifier 70 receives a detection voltage Vs at a first input terminal (inverting input terminal) of the error amplifier 70 according to the voltage decrease of the detection resistor Rs, and receives a control signal $V_{CNT}$ at a second input terminal (non-inverting input terminal) of the error amplifier 70 via the low-pass filter 16. The output of error amplifier 70 is connected to the control terminal (gate) of the output transistor M1.

According to the configuration above, the driving current $I_{DRV}$ represented by the following expression (1) is generated.

$$I_{DRV}=V_{CNT}/Rs \quad (1)$$

Figure 7:
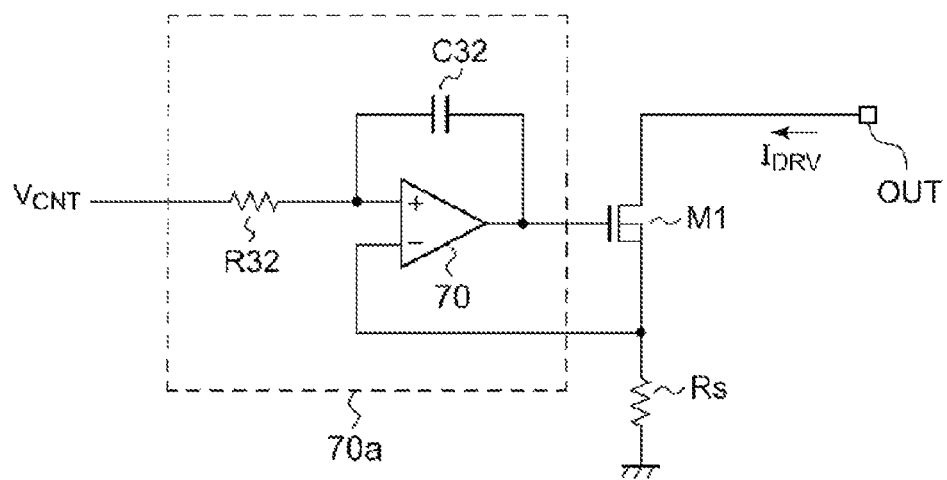
FIG. 7 is a circuit diagram of a driving circuit related to the second embodiment.

FIG. 7 is a circuit diagram of a driving circuit 2 according to the second embodiment. In this embodiment, the low-pass filter 16 is integrally formed with the current driver 14. Specifically, the low-pass filter 16 and the error amplifier 70 in FIG. 6 are integrally formed as an integrated amplifier 70a. The integrated amplifier 70a includes an input resistor R32 and a feedback capacitor C32, in addition to the error amplifier 70.

Figure 8:
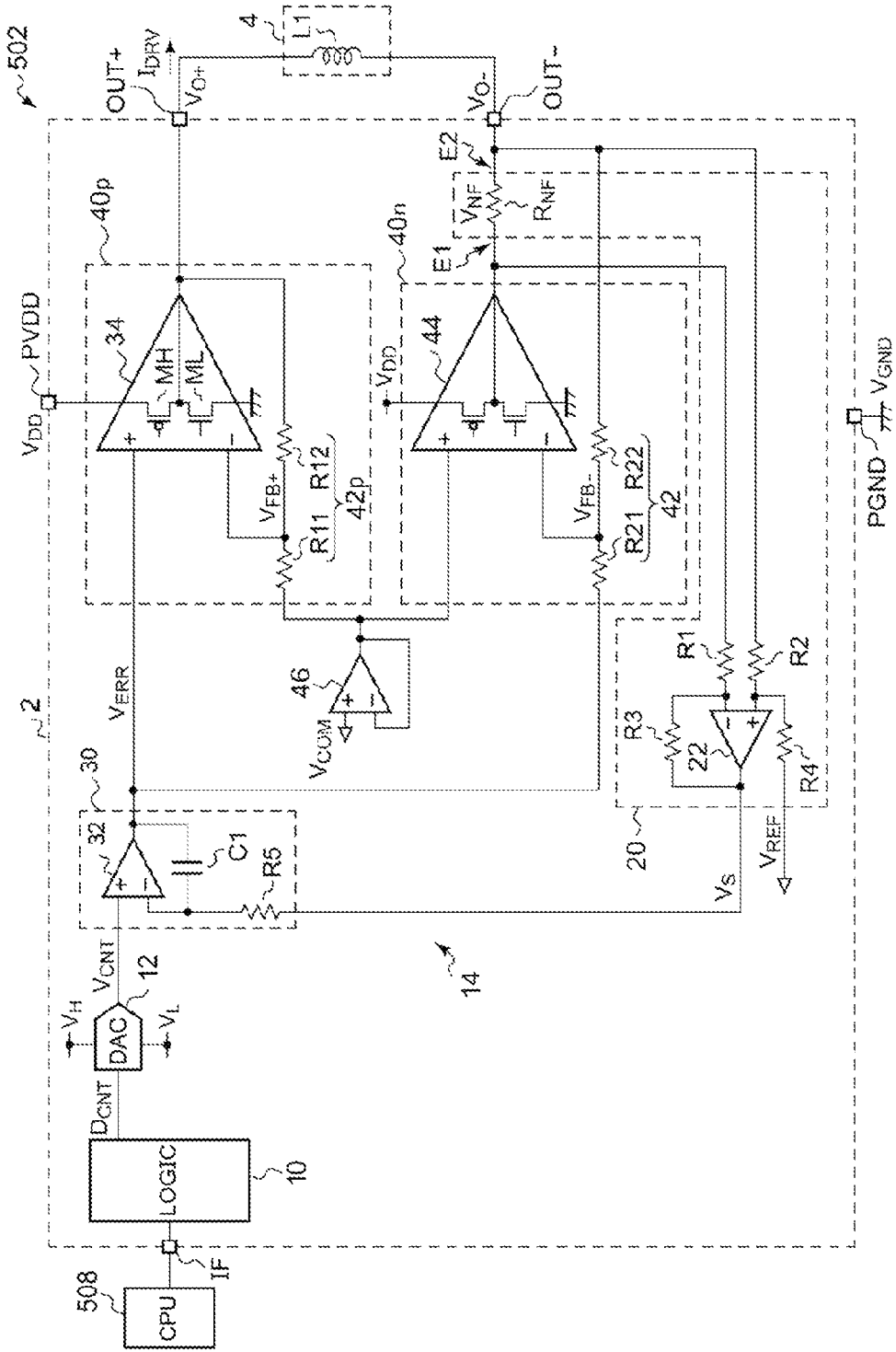
FIG. 8 is a circuit diagram of a driving circuit related to the third embodiment.

FIG. 8 is a circuit diagram of a driving circuit 2 according to the third embodiment. While the driving circuit 2 that has been described so far generates a uni-directional driving current $I_{DRV}$, the driving circuit 2 of FIG. 8 is capable of generating a bi-directional driving current $I_{DRV}$. Therefore, it is capable of driving the VCM 4, which does not have a spring return mechanism. In this embodiment, similarly to FIG. 7, the current driver 14 and the low-pass filter 16 are integrally formed.

The current driver 14 includes a current detection circuit 20, an error amplifier 30, a first driver 40p, and a second driver 40n.

The current detection circuit 20 detects a driving current $I_{DRV}$ flowing through a coil L1, and generates a detection voltage Vs according to the driving current $I_{DRV}$. The detection voltage Vs is represented by the following expression (2) using the gain k and the reference voltage $V_{REF}$.

$$Vs=V_{REF}+k \cdot I_{DRV} \quad (2)$$

For example, the current detection circuit 20 includes a first operational amplifier 22, a detection resistor $R_{NF}$, a first resistor R1, a second resistor R2, a third resistor R3, and a fourth resistor R4. The detection resistor $R_{NF}$ is arranged on a path of the driving current $I_{DRV}$. For example, the detection resistor $R_{NF}$ is arranged between the second end of the coil L1 and the output terminal of the second driver 40n. Alternatively, the detection resistor $R_{NF}$ may be arranged between the first end of the coil L1 and the output terminal of the first driver 40p. At the detection resistor $R_{NF}$, a voltage decrease $V_{NF}$ occurs in proportion to the driving current $I_{DRV}$.

The first resistor R1 is arranged between the first input terminal (inverting input terminal) of the first operational amplifier 22 and the first end E1 of the detection resistor $R_{NF}$. The second resistor R2 is arranged between the second input terminal (non-inverting input terminal) of the first operational amplifier 22 and the second end E2 of the detection resistor $R_{NF}$. The third resistor R3 is arranged between the output terminal and the first input terminal (inverting input terminal) of the first operational amplifier 22. The fourth resistor R4 has its one end connected to the second input terminal (non-inverting input terminal) of the first operational amplifier 22 and the other end to which a reference voltage $V_{REF}$ is applied.

If the potentials of the first end E1 and the second end E2 of the detection resistor $R_{AF}$ are V1 and V2, respectively, the detection voltage Vs is represented by the expression (3), when R1=R2=Ra, and R3=R4=Rb.

$$Vs=V_{REF}+Rb/Ra \cdot (V2-V1) \quad (3)$$

If the expression (3) is substituted by the expression (4), the expression (5) is obtained.

$$V_{NF}=V2-V1=R_{NF} \times I_{DRV} \quad (4)$$

$$V_s=V_{REF}+Rb/Ra \times R_{NF} \times I_{DRV} \quad (5)$$

Therefore, the gain k of the current detection circuit 20 is $Rb/Ra \times R_{NF}$.

Moreover, the configuration of the current detection circuit 20 is not limited to that shown in FIG. 8 and other configurations may be used.

The error amplifier 30 amplifies the error between the control voltage $V_{CNT}$, which indicates the displacement of the voice coil motor, and the detection voltage Vs and thereby generates an error voltage $V_{ERR}$. For example, the error amplifier 30 may be an integrated amplifier. Accordingly, the function of the low-pass filter 16 in FIG. 3 can be provided.

For example, the error amplifier 30 includes a second operational amplifier 32, a first capacitor C1 and a fifth resistor R5.

At the first input terminal (non-inverting input terminal) of the second operational amplifier 32, the control voltage $V_{CNT}$ is inputted. The first capacitor C1 is arranged between the second input terminal (inverting input terminal) and the output terminal of the second operational amplifier 32. The fifth resistor R5 has the first end connected to the second input terminal (inverting input terminal) of the second operational amplifier 32 and the second end to which the detection voltage Vs is applied.

The configuration of the error amplifier 30 is not limited to that shown in FIG. 8.

The first driver 40p is connected to the one end of the coil L1 of the voice coil motor 4 and sources or sinks the driving current $I_{DRY}$ according to the error voltage $V_{ERR}$. The second driver 40n operates in a reverse phase to the first driver 40p. The second driver 40n is connected to the other end of the coil L1 of the voice coil motor 4 and sources or sinks the driving current $I_{DRV}$ according to the error voltage $V_{ERR}$.

A buffer 46 outputs a predetermined common voltage $V_{COM}$. The first driver 40p includes a non-inverting amplifier that amplifies the error voltage $V_{ERR}$ in a non-inverting manner with the common voltage $V_{COM}$ as a reference and applies a first driving voltage $V_{O+}$ to the first end of the coil L1. In addition, the second driver 40n includes an inverting amplifier which amplifies the error voltage $V_{ERR}$ in an inverting manner with the common voltage $V_{COM}$ as a reference and applies a second driving voltage $V_{O-}$, which has a reverse phase to the first driving voltage $V_{O+}$, to the second end of the coil L1.

More specifically, the first driver 40p includes a first divider circuit 42p and a first amplifier 34. The first divider circuit 42p includes resistors R11 and R12 and divides the first output voltage $V_{O+}$ generated at the first end of the coil L1 and the predetermined common voltage $V_{COM}$ with a predetermined division ratio. The first amplifier 34 has a push-pull output terminal consisting of a high side transistor MH and a low side transistor ML. The first amplifier 34 controls the high side transistor MH and the low side transistor ML of the push-pull output terminal such that the voltage $V_{FB+}$ divided by the first divider circuit 42p is equalized to the error voltage $V_{ERR}$.

The second driver 40n includes a second divider circuit 42 and a second amplifier 44. The second amplifier 44 includes resistors R21 and R22 and divides the second output voltage $V_{O-}$ generated at the second end of the coil L1 and the error voltage $V_{ERR}$ with a predetermined division ratio. The second amplifier 44 has a push-pull output terminal consisting of a high side transistor MH and a low side transistor ML. The second amplifier 44 controls the high side transistor MH and the low side transistor ML of the push-pull output terminal such that the voltage $V_{FB-}$ divided by the second divider circuit 42 is equalized to the common voltage $V_{COM}$.

The driving circuit 2 generates the driving voltages $V_{O+}$ and $V_{O-}$ such that the detection voltage Vs is to be identical to the control voltage $V_{CNT}$ with a feedback loop including the error amplifier 30. As described above, since the detection voltage Vs is represented by the expression (3), the driving current $I_{DRV}$ is feedback controlled so as to approximate the target value represented by the following expression.

$$I_{DRV} = (V_{CNT} - V_{REF})/k$$

The voltage range of the control voltage $V_{CNT}$ is 0 to $V_H$. Thus, the maximum value $I_{MAX}$ of the driving current $I_{DRV}$ is $I_{MAX} = (V_H - V_{REF})/k$ and the minimum value $I_{MIN}$ of the driving current $I_{DRV}$ is $I_{MIN} = -V_{REF}/k$. The change range of the driving current $I_{DRV} \Delta I = I_{MAX} - I_{MIN}$ is $V_H/k$, which is constant and irrelevant to the value of the reference voltage $V_{REF}$.

Therefore, when using the driving circuit 2, it is possible to arbitrarily set the range of the driving current $I_{DRV}$ according to a level of the reference voltage $V_{REF}$. For example, if the reference voltage $V_{REF}$ is the center value $V_H/2$ of the voltage range 0 to $V_H$ of the control voltage $V_{CNT}$, then $I_{MAX} = -I_{MIN}$ so that the maximum values of the currents capable of flowing in the positive and negative directions are equalized. If the reference voltage $V_{REF}$ is higher than the center value $V_H/2$, the amount of the current capable of flowing in the negative direction becomes greater. On the other hand, if the reference voltage $V_{REF}$ is lower than the center value $V_H/2$, the amount of the current capable of flowing in the positive direction becomes greater.

In addition, the VCM 4 having a spring return mechanism may be driven using the current driver 14 of FIG. 8.

Figure 9:
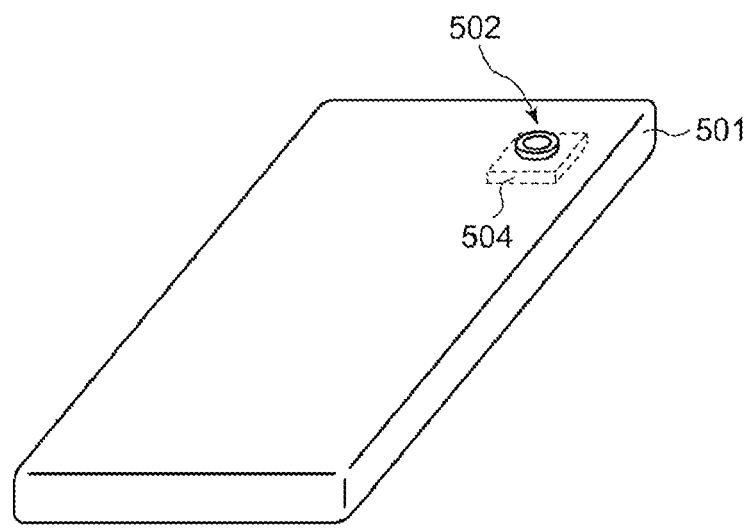
FIG. 9 is a perspective view showing a cellular phone terminal which is an example of electronic devices.

Subsequently, a specific embodiment of the electronic device 500 will be described. FIG. 9 is a perspective view showing a cellular phone terminal which is an example of the electronic device 500. The electronic device 500 includes a housing 501, a lens module 502, and an image acquisition device 504. The image acquisition device 504 is mounted inside the housing 501. In the housing 501, an opening is formed at the portion overlapping the image acquisition device 504 and the lens module 502 is installed at the opening.

In the above, some embodiments of the present disclosure are described. Those embodiments are merely presented by way of example. Those skilled in the art would understand that various modifications are possible in the combination of each element or each process of those embodiments, and such modifications would fall within the scope of the present disclosure. Hereinafter, exemplary modifications will be described.

Modification 1

With respect to the driving circuit 2 of FIG. 8, the first driver 40p and the second driver 40n have been described to linearly drive the VCM 4. However, alternatively, those drivers may perform the PWM driving. Thus, the first driver 40p and the second driver 40n may generate the driving voltages $V_{O+}$ and $V_{O-}$ in a pulse form, respectively, and may change the duty ratio of the driving voltages $V_{O+}$ and $V_{O-}$ according to the error voltage $V_{ERR}$.

Modification 2

With respect to the driving circuit 2 of FIG. 8, the detection resistor R has been described to be arranged between the second driver 40n (or the first driver 40p) and the coil L1. However, the location of the detection resistor R is not limited thereto. The detection resistor R may be arranged in series with the high side transistor MH between the output terminal OUT+ (or OUT−) and the power line or in series with the low side transistor ML between the output terminal OUT+(or OUT−) and the ground line. Alternatively, for the detection resistor $R_{NF}$, on-resistance of the transistor (MH, ML) forming the output terminal of the first driver 40p and/or on-resistance of the transistor (MH, ML) forming the output terminal of the second driver 40n may be used.

If the DC resistance component (parasitic resistor) of the VCM 4 is known, the resistance value may be used as the detection resistor $R_{NF}$. The voltage between both ends of the VCM 4 is the sum of a voltage decrease generated at the resistance component and a back electromotive force generated at the inductance L1. Therefore, the current detection circuit 20 may remove the back electromotive force generated at the coil L1 from the voltage between both ends of the VCM 4 to detect the voltage decrease of the resistance component. A known technology may be used as such current detection circuit.

While the lens module for focusing has been described in relation with the above embodiments, the use of the driving circuit 2 is not limited thereto. For example, the VCM 4 may drive a lens for hand-shake correction.

According to any one of embodiments of the present disclosure, it is possible to control a driving current with high precision, while suppressing the increase of a circuit area.

While the present disclosure has been described using specific terms based on some embodiments, such description is only for simply representing the applications and principles of the present disclosure, and various modifications of changes of arrangements may be made without departing from the spirit of the present disclosure, which is specified in the scope of the claims.

What is claimed is:

1. A driving circuit configured to supply a driving current to a voice coil motor, the driving circuit comprising:

a D/A converter of a second number (N) of bits, wherein the second number (N) is an integer;

a current driver configured to generate the driving current based on a control signal outputted from the D/A converter; and a logic unit configured to receive an input control data having a first number (M) of bits and output an intermediate control data having the second number (N) of bits to the D/A converter, wherein the first number (M) is an integer larger than the second number (N), and wherein the logic unit comprises:

a data extraction unit configured to divide the input control data into a first data having the second number (N) of bits from a most significant bit of the input control data and a second data having a third number (M−N) of bits from a least significant bit of the input control data, wherein the third number (M−N) corresponds to a number from subtracting the second number (N) from the first number (M);

a counter configured to accumulatively add the second data in synchronization with a clock signal to generate a count value having the third number (M−N) of bits;

a carry detection unit configured to assert a carry signal when a carry at a most significant bit of the count value is generated by the counter; and an output control unit configured to set the intermediate control data as the first data in a cycle where the carry signal is negated or set the intermediate control data as a third data, in which one least significant bit is added to the first data, in a cycle where the carry signal is asserted.

2. The driving circuit of claim 1, further comprising a low-pass filter interposed between the D/A converter and the current driver.

3. The driving circuit of claim 1, wherein the current driver comprises an integrated amplifier.

4. The driving circuit according to claim 1, wherein the driving circuit is integrated into a single semiconductor substrate.

5. The driving circuit of claim 1, wherein the current driver comprises:

an output transistor and a detection resistor, which are arranged in series between a fixed voltage terminal and an output terminal where the voice coil motor is connected; and an error amplifier configured to receive a detection voltage according to a voltage decrease of the detection resistor at its first input, receive a control signal at its second input, and have its output connected to a control terminal of the output transistor.

6. The driving circuit of claim 5, wherein the error amplifier is an integrated amplifier.

7. The driving circuit of claim 1, wherein the current driver comprises:

a current detection circuit configured to generate a detection voltage according to the driving current;

an error amplifier configured to generate an error voltage by amplifying an error between the control signal and the detection voltage;

a first driver connected to one end of a coil of the voice coil motor and configured to source or sink the driving current according to the error voltage; and a second driver connected to the other end of the coil of the voice coil motor and configured to source or sink the driving current according to the error voltage.

8. The driving circuit of claim 7, wherein the error amplifier is an integrated amplifier.

9. A lens module comprising:

a focusing lens;

a voice coil motor having its mover connected to the focusing lens; and a driving circuit according to claim 1, the driving circuit configured to drive the voice coil motor.

10. An electronic device comprising:

a lens module according to claim 9; and an image acquiring device configured to acquire an image from light that passes through the lens module.

11. A lens module comprising:

a hand-shake correction lens;

a voice coil motor having its mover connected to the hand-shake correction lens; and a driving circuit according to claim 1, the driving circuit configured to drive the voice coil motor.

12. An electronic device comprising:

a lens module according to claim 11; and an image acquiring device configured to acquire an image from light that passes through the lens module.

13. A driving method for driving a voice coil motor, comprising:

generating input control data having a first number (M) of bits;

converting the input control data having the first number (M) of bits into intermediate control data having a second number (N) of bits, wherein the first number (M) is larger than the second number (N);

converting the intermediate control data having the second number (N) of bits into a control signal by a D/A converter of the second number (N) of bits; and supplying a driving current according to the control signal to the voice coil motor, wherein the converting the input control data into the intermediate control data comprises dividing the input control data having the first number of bits into a first data having the second number (N) of bits from a most significant bit of the input control data and a second data having a third number (M−N) of bits from a least significant bit of the input control data, wherein the third number (M−N) corresponds to a number from subtracting the second number (N) from the first number (M), wherein the converting the intermediate control data into the control signal by the D/A converter comprises:

accumulatively adding the second data using a counter to generate a count value having the third number (M−N) bits;

asserting a carry signal when a carry at a most significant bit of the count value is generated by the counter; and setting the intermediate control data as the first data in a cycle where the carry signal is negated or setting the intermediate control data as a third data, in which one least significant bit is added to the first data, in a cycle where the carry signal is asserted, and wherein the first number (M) and the second number (N) are integers.

* * * * *